(12) United States Patent
Cho et al.

(10) Patent No.: US 10,184,174 B2
(45) Date of Patent: Jan. 22, 2019

(54) METHOD FOR MAKING AIRCRAFT BRAKE DISC

(71) Applicant: DACC CARBON, Jeonju-si (KR)

(72) Inventors: Chae Wook Cho, Daejeon (KR); Jong Hyun Park, Jeonju (KR); Min Cheol Cho, Daegu (KR); Kap Su Jung, Jeonju (KR); Gi Bum Ryu, Gunsan-si (KR)

(73) Assignee: DACC CARBON, Jeonju-si (KR)

( * ) Notice: Subject to any disclaimer, the term of this patent is extended or adjusted under 35 U.S.C. 154(b) by 594 days.

(21) Appl. No.: 14/580,635

(22) Filed: Dec. 23, 2014

(65) Prior Publication Data
US 2015/0240352 A1    Aug. 27, 2015

(30) Foreign Application Priority Data

Feb. 27, 2014  (KR) .................. 10-2014-0022988

(51) Int. Cl.
| | | |
|---|---|---|
| C23C 14/26 | (2006.01) | |
| H05B 6/02 | (2006.01) | |
| H05B 6/24 | (2006.01) | |
| C23C 16/26 | (2006.01) | |
| C23C 16/46 | (2006.01) | |
| C23C 16/04 | (2006.01) | |
| C23C 16/52 | (2006.01) | |

(52) U.S. Cl.
CPC ............ *C23C 16/26* (2013.01); *C23C 16/045* (2013.01); *C23C 16/46* (2013.01); *C23C 16/52* (2013.01)

(58) Field of Classification Search
CPC ....... C23C 16/26; C23C 16/52; C23C 16/045; C23C 16/46; F16D 69/023
USPC .................................................. 427/585, 587
See application file for complete search history.

(56) References Cited

U.S. PATENT DOCUMENTS

| 3,708,042 A | * | 1/1973 | Krause .................... F16D 55/36 |
| | | | 188/218 XL |
| 5,634,435 A | | 6/1997 | Fennell et al. |
| 5,900,297 A | * | 5/1999 | Rudolph .................. C04B 35/83 |
| | | | 188/18 A |

FOREIGN PATENT DOCUMENTS

| KR | 20000046418 A | * | 7/2000 |
| KR | 1020030089880 | | 11/2003 |

OTHER PUBLICATIONS

Machine Translation of KR 20000046418 A.*
Moon-Gab Kam et al., Development of Brake disc using CFRC on Anti-lock Brake System of Aircraft, 2007.
Machine Translation of KR 20000046418 A, translation generated Mar. 17, 2017.

* cited by examiner

*Primary Examiner* — Michael P Wieczorek
*Assistant Examiner* — Michael G Miller
(74) *Attorney, Agent, or Firm* — Hauptman Ham, LLP

(57) ABSTRACT

A method for making an aircraft brake disc includes: a first step of manufacturing a rotary disc preform for manufacturing a rotary disc and a fixing disc preform for manufacturing a fixing disc; and a second step of densifying the rotary disc preform such that density continuously increases from the center to the outside of the rotary disc and of densifying the fixing disc preform such that density continuously decreases from the center to the outside of the fixing disc.

1 Claim, 11 Drawing Sheets

METHOD FOR MAKING AIRCRAFT BRAKE DISC

CROSS-REFERENCE TO RELATED APPLICATIONS

This application claims the priority of Korean Patent Application No. 10-2014-0022988 filed on Feb. 27, 2014, in the Korean Intellectual Property Office, the disclosure of which is incorporated herein by reference.

BACKGROUND OF THE INVENTION

Field of the Invention

The present invention relates to a method for making an aircraft brake disc.

Description of the Related Art

The background of the present invention has been disclosed in Korean Patent No. 10-0447840.

An aircraft brake disc is composed of a pressure disc, a rear disc, and rotary discs and fixing discs that are alternately disposed between the pressure disc and the rear disc.

The pressure disc, the rear disc, the rotary disc, and the fixing disc increase in temperature over 1000° C. due to friction therebetween, when an aircraft is landing. The pressure disc, the rear disc, the rotary disc, and the fixing disc are made of a carbon-carbon composite to maintain friction or mechanical strength against the high temperature.

The carbon-carbon composite is a material that keeps friction or mechanical strength even at a high temperature over 2500° C. and has excellent resistance against thermal shock and excellent thermal conductivity.

The rotary disc is coupled to a drive key of a wheel frame of an aircraft and rotates with the wheel frame. The fixing disc is coupled to the splines of a torque tube included in an aircraft brake system, so it does not rotate with the wheel frame of an aircraft.

Larger torque and shock are applied to the portion coupled to a drive key of the rotary disc than other portions of the rotary disc, when a brake system is operated. Accordingly, the portion coupled to a drive key of the rotary disc is easier to crack or break than other portions of the rotary disc. When the portion coupled to a drive key of the rotary disc starts cracking or breaking, the entire rotary disc consequently breaks and cannot be used.

Similarly, larger torque and shock are applied to the portion coupled to splines of the fixing disc than other portions of the fixing disc, when a brake system is operated. Accordingly, the portion coupled to splines of the fixing disc is easier to crack or break than other portions of the fixing disc. When the portion coupled to splines of the fixing disc starts cracking or breaking, the entire fixing disc consequently breaks and cannot be used.

In order to solve those problems, metal clips are attached to the portion coupled to a drive key of the rotary disc and the portion coupled to splines of the fixing disc in order to protect the rotary disc and the fixing disc against torque and shock.

However, it is difficult to sufficiently protect the rotary disc and the fixing disc against torque and shock, only with the metal clips.

SUMMARY OF THE INVENTION

An aspect of the present invention provides a method for making an aircraft brake disc that can sufficiently protect a rotary disc against torque and shock transmitted from a drive key and can sufficiently protect a fixing disc from torque and shock transmitted from splines.

According to an aspect of the present invention, there is provided a method for making an aircraft brake disc that includes: a first step of manufacturing a rotary disc preform for manufacturing a rotary disc and a fixing disc preform for manufacturing a fixing disc; and a second step of densifying the rotary disc preform such that density continuously increases from the center to the outside of the rotary disc and of densifying the fixing disc preform such that density continuously decreases from the center to the outside of the fixing disc.

According to another aspect of the present invention, there is provided a method for making an aircraft brake disc that includes: a first step of manufacturing a rotary disc preform for manufacturing a rotary disc and a fixing disc preform for manufacturing a fixing disc; and a second step of densifying the rotary disc preform such that density is uniform from the center to the portion close to the outside of the rotary disc and is higher only at the portion around the outside, and of densifying the fixing disc preform such that density is uniform from the portion close to the center to the outside of the fixing disc and is higher only around the center of the fixing disc.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Hereinafter, a method for making an aircraft brake disc according to a first embodiment of the present invention will be described in detail.

Figure 1:
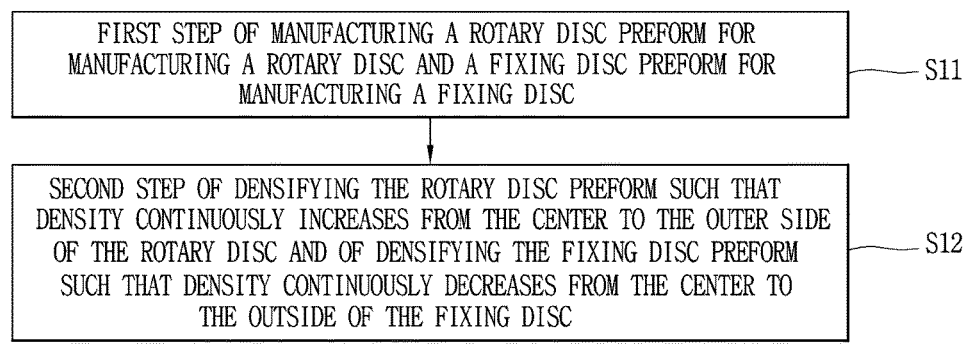
FIG. 1 is a flowchart illustrating a method for making an aircraft brake disc according to a first embodiment of the present invention.

FIG. 1 is a flowchart illustrating a method for making an aircraft brake disc according to a first embodiment of the present invention.

As illustrated in FIG. 1, a method for making an aircraft brake disc according to the first embodiment of the present invention includes: a first step of manufacturing a rotary disc preform for manufacturing a rotary disc and a fixing disc preform for manufacturing a fixing disc (S11); and a second step of densifying the rotary disc preform such that density continuously increases from the center to the outer side of the rotary disc and of densifying the fixing disc preform such that density continuously decreases from the center to the outside of the fixing disc (S12).

The first step (S11) is described.

A rotary disc preform and a fixing disc preform are formed in the types of a two dimension preform and a three dimension preform.

[Two Dimension Preform]

A heat resistant fiber and resin are put into a mold and then mixed therein. An oxi-pan fiber, a carbon fiber, or silicon carbide fiber is used for the heat resistant fiber. The heat resistant fiber may be mixed and then put into the mold. The resin may be phenol resin, furan resin, coal tar pitch, or petroleum pitch. A preform is obtained by pressing the heat resistant fiber and the resin mixed in the mold and then heating the mixture. The preform is taken out of the mold and then put into a carbonization furnace. The preform is carbonized at a high temperature over 900° C. A carbide with components except carbon removed is obtained. A hole is formed at the center of the carbide to insert an electrode rod of a thermal gradient chemical vapor deposition apparatus. A rotary disc preform and a fixing disc preform are formed in the types of two dimension preforms in this way.

[Three Dimension Preform]

Heat resistant fabrics are formed. The heat resistant fabrics are formed by weaving an oxi-pan fiber, a carbon fiber, or silicon carbide fiber. A staple fiber made of an oxi-pan fiber is applied onto the heat resistant fabrics. The heat resistant fabrics are stacked. Angles such as ±30°, ±45°, ±60°, and ±90° may be given, when the heat resistant fabrics are stacked. The stacked heat resistant fabrics are punched with a needle. The needle moves down with staple fiber. The staple fiber combines the stacked heat resistant fabrics, thereby forming a preform. The preform is taken out of the needle punching equipment and then put into a carbonization furnace. The preform is carbonized at a high temperature over 900° C. A carbide with components except carbon removed is obtained. A hole is formed at the center of the carbide to insert an electrode rod of a thermal gradient chemical vapor deposition apparatus. A rotary disc preform and a fixing disc preform are formed in the types of three dimension preforms in this way.

The second step (S12) is described.

Figure 2:
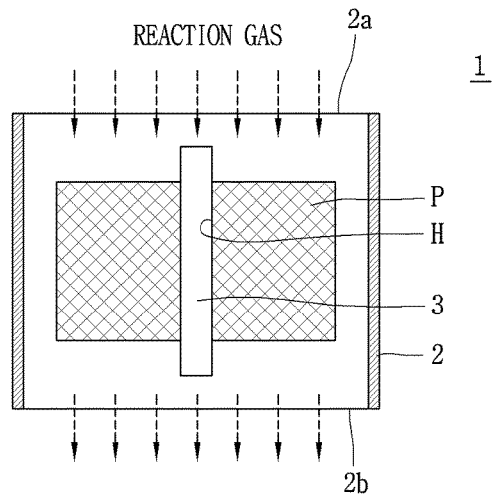
FIG. 2 is a diagram simply illustrating a thermal gradient chemical vapor deposition apparatus.

FIG. 2 is a diagram simply illustrating a thermal gradient chemical vapor deposition apparatus.

As illustrated in FIG. 2, a thermal gradient chemical vapor deposition apparatus 1 is composed of a chamber 2 and an electrode rod 3 at the center of the chamber 1. The electrode rod 3 is made of graphite. The electrode rod 3 generates heat when receiving electricity. The electrode rod 3 is inserted into a hole H of a preform P. The diameter of the electrode rod 3 is smaller by 0.2 to 0.5 mm than that of the hole H so that the electrode rod 3 can be smoothly inserted into the hole H and heat can transfer well to the preform P. A reaction gas is injected into the chamber through an inlet 2a and then discharged outside the chamber through an outlet 2b. The reaction gas may be a hydrocarbon gas such as methane or propane.

As the electrode rod 3 heats the preform P, the heat propagates from the center to the outer side of the preform P. When the temperature of the preform P reaches 700° C. or more, the reaction gas is thermally decomposed and carbon is deposited by pores in the preform. The preform is densified in this way.

[First Method of Densifying a Rotary Disc According to the First Embodiment (Temperature Changed and Flow Rate Fixed)]

Figure 3A:
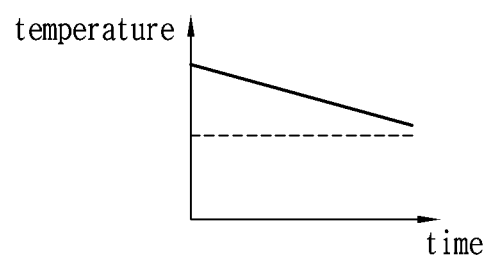
FIG. 3A is a graph illustrating a temperature change of an electrode rod with lapse of time.
Figure 3B:
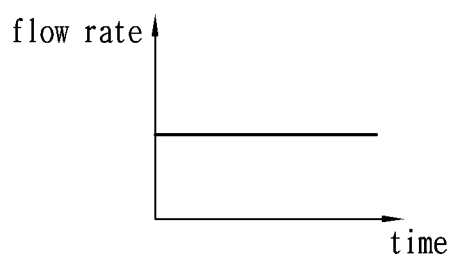
FIG. 3B is a graph illustrating a flow rate change of a reaction gas with lapse of time.
Figure 3C:
FIG. 3C is a diagram illustrating a density gradient of the rotary disc preform.
Figure 3E:
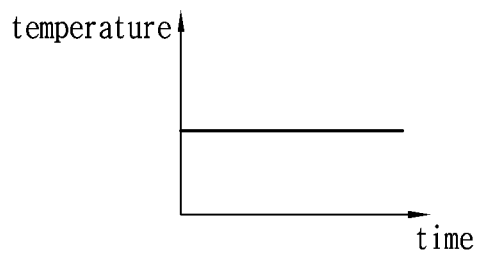
FIG. 3E is a graph illustrating a temperature change of an electrode rod with lapse of time.
Figure 3F:
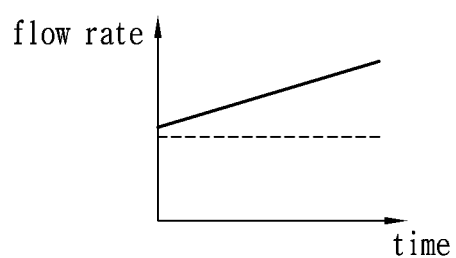
FIG. 3F is a graph illustrating a flow rate change of a reaction gas with lapse of time.
Figure 3G:
FIG. 3G is a diagram illustrating a density gradient of the rotary disc preform.

FIG. 3A is a graph illustrating a temperature change of an electrode rod with lapse of time. FIG. 3B is a graph illustrating a flow rate change of a reaction gas with lapse of time. FIG. 3C is a diagram illustrating a density gradient of the rotary disc preform. FIG. 3E is a graph illustrating a temperature change of an electrode rod with lapse of time. FIG. 3F is a graph illustrating a flow rate change of a reaction gas with lapse of time. FIG. 3G is a diagram illustrating a density gradient of the rotary disc preform.

Referring to FIGS. 2, 3A, 3B, 3C, 3E, 3F and 3G, the electrode rod 3 is put into the hole H of the rotary disc preform P.

As illustrated in FIG. 3A, the temperature of the electrode rod 3 is continuously decreased, as time passes. As illustrated in FIG. 3B, the flow rate of the reaction gas is kept constant, even though time passes. Accordingly, as illustrated in FIG. 3C, the carbon of the reaction gas is much deposited, as it goes from the center to the outside of the rotary disc preform P.

The reason is as follows.

The higher the temperature of the electrode rod 3, the more the heat rapidly transfers and the more the area where the carbon of the reaction gas can be deposited rapidly increases, whereas the lower the temperature of the electrode rod 3, the more the heat slowly transfers and the more the area where the carbon of the reaction gas can be deposited slowly increases.

Since the flow rate of the reaction gas is constant, as the area rapidly increases, the amount of carbon of the reaction gas that can be deposited per unit area decreases and the density decreases, but as the area slowly increases, the amount of carbon of the reaction gas that can be deposited per unit area increases and the density increases. Accordingly, the density of the rotary disc preform P continuously increases from the center to the outside. The density is indicated by the depth of a color. That is, lower density is illustrated lighter and higher density is illustrated darker. Those are the same in the following description.

For reference, to avoid complication in description, the increase amount of the reaction gas for the unit area, which increases from the center to the outside because the rotary disc preform P has a circular shape, is not considered. This is the same in the following description.

Accordingly, the density of the rotary disc made of the rotary disc preform P also continuously increases from the center to the outside.

[First Method of Densifying a Fixing Disc According to the First Embodiment (Temperature Changed and Flow Rate Fixed)]

Figure 4A:
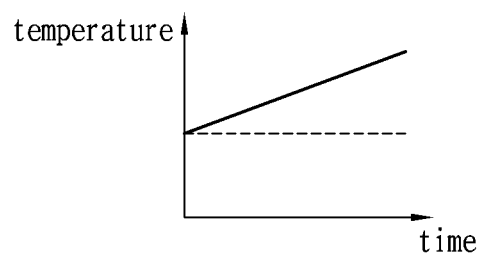
FIG. 4A is a graph illustrating a temperature change of an electrode rod with lapse of time.
Figure 4B:
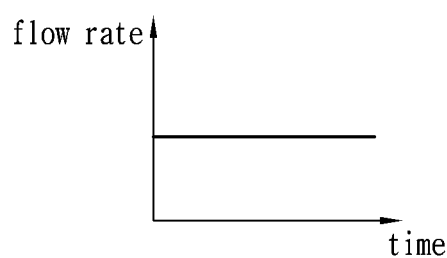
FIG. 4B is a graph illustrating a flow rate change of a reaction gas with lapse of time.
Figure 4C:
FIG. 4C is a diagram illustrating a density gradient of the fixing disc preform.
Figure 4E:
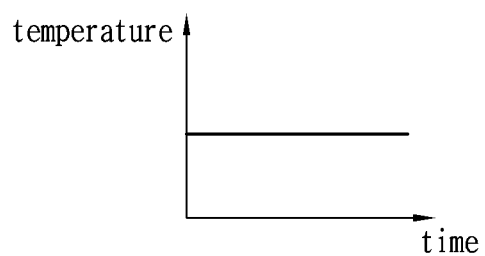
FIG. 4E is a graph illustrating a temperature change of an electrode rod with lapse of time.
Figure 4F:
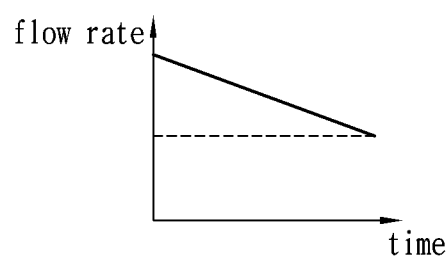
FIG. 4F is a graph illustrating a flow rate change of a reaction gas with lapse of time.
Figure 4G:
FIG. 4G is a diagram illustrating a density gradient of the fixing disc preform.

FIG. 4A is a graph illustrating a temperature change of an electrode rod with lapse of time. FIG. 4B is a graph illustrating a flow rate change of a reaction gas with lapse of time. FIG. 4C is a diagram illustrating a density gradient of the fixing disc preform. FIG. 4E is a graph illustrating a temperature change of an electrode rod with lapse of time. FIG. 4F is a graph illustrating a flow rate change of a reaction gas with lapse of time. FIG. 4G is a diagram illustrating a density gradient of the fixing disc preform.

Referring to FIGS. 2, 4A, 4B, 4C, 4E, 4F and 4G, the electrode rod 3 is put into the hole H of the fixing disc preform P.

As illustrated in FIG. 4A, the temperature of the electrode rod 3 is continuously increased, as time passes. As illustrated in FIG. 4B, the flow rate of the reaction gas is kept constant, even though time passes. Accordingly, as illustrated in FIG. 4C, the carbon of the reaction gas is less deposited, as it goes from the center to the outside of the fixing disc preform P.

The reason is as follows.

The higher the temperature of the electrode rod 3, the more the heat rapidly transfers and the more the area where the carbon of the reaction gas can be deposited rapidly increases, whereas the lower the temperature of the electrode rod 3, the more the heat slowly transfers and the more the area where the carbon of the reaction gas can be deposited slowly increases.

Since the flow rate of the reaction gas is constant, as the area rapidly increases, the amount of carbon of the reaction gas that can be deposited per unit area decreases and the density decreases, but as the area slowly increases, the amount of carbon of the reaction gas that can be deposited per unit area increases and the density increases. Accordingly, the density of the fixing disc preform P continuously decreases from the center to the outside.

For reference, to avoid complication in description, the increase amount of the reaction gas for the unit area, which increases from the center to the outside because the fixing disc preform P has a circular shape, is not considered. This is the same in the following description.

Accordingly, the density of the fixing disc made of the fixing disc preform. P also continuously decreases from the center to the outside.

[Second Method of Densifying a Rotary Disc According to the First Embodiment (Temperature Fixed and Flow Rate Changed)]

As illustrated in FIG. 3E, the temperature of the electrode rod 3 is kept constant, even though time passes. As illustrated in FIG. 3F, the flow rate of the reaction gas increases, as time passes. Accordingly, as illustrated in FIG. 3G, the carbon of the reaction gas is much deposited, as it goes from the center to the outside of the rotary disc preform P.

The reason is as follows.

Since the temperature of the electrode rod 3 is constant, heat uniformly transfers and the area, where the reaction gas can be thermally decomposed, uniformly increases. As the flow rate of the reaction gas increases, the amount of carbon that is deposited in the same unit area gradually increases. Accordingly, the amount of carbon that is deposited increases from the center to the outside of the rotary disc preform P.

Accordingly, the density of the rotary disc preform P continuously increases from the center to the outside.

Therefore, the density of the rotary disc made of the rotary disc preform P also continuously increases from the center to the outside.

[Second Method of Densifying a Fixing Disc According to the First Embodiment (Temperature Fixed and Flow Rate Changed)]

As illustrated in FIG. 4E, the temperature of the electrode rod 3 is kept constant, even though time passes. As illustrated in FIG. 4F, the flow rate of the reaction gas decreases, as time passes. Accordingly, as illustrated in FIG. 4G, the carbon of the reaction gas is less deposited, as it goes from the center to the outside of the fixing disc preform P.

The reason is as follows.

Since the temperature of the electrode rod 3 is constant, heat uniformly transfers and the area, where the reaction gas can be thermally decomposed, uniformly increases. As the flow rate of the reaction gas decreases, the amount of carbon that is deposited in the same unit area gradually decreases. Accordingly, the amount of carbon that is deposited decreases from the center to the outside of the fixing disc preform P.

Accordingly, the density of the fixing disc preform P continuously decreases from the center to the outside.

Accordingly, the density of the fixing disc made of the fixing disc preform. P also continuously decreases from the center to the outside.

Figure 5:
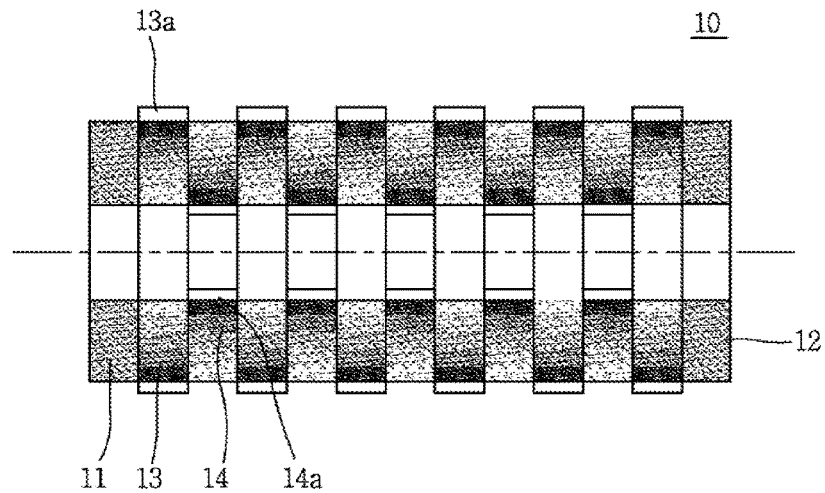
FIG. 5 is a diagram illustrating an aircraft brake disc manufactured by the method for making an aircraft brake disc according to the first embodiment of the present invention.

FIG. 5 is a diagram illustrating an aircraft brake disc manufactured by the method for making an aircraft brake disc according to the first embodiment of the present invention.

As illustrated in FIG. 5, an aircraft brake disc 10 manufactured by the method for making an aircraft brake disc according to the first embodiment of the present invention includes a pressure disc 11, a rear disc 12, and rotary discs 13 and fixing discs 14 that are alternately disposed between the pressure disc 11 and the rear disc 12. A drive groove 13a where a drive key is inserted is formed on the outside of the rotary disc 13. A spline groove 14a where splines are inserted is formed at the center of the fixing disc 14.

The density of the rotary disc 13 continuously increases from the center to the outside. The density of the fixing disc 14 continuously increases from the outside to the center.

In the first embodiment, the density of the rotary disc 13 continuously increases from 1.7 g/cm³ at the center to 1.9 g/cm³ at the outside. Since the larger the density, the higher the strength, strength is high around the drive groove 13a.

The density of the fixing disc 13 continuously increases from 1.7 g/cm³ at the outside to 1.9 g/cm³ at the center. Since the larger the density, the higher the strength, strength is high around the spline groove 14a.

Hereinafter, a method for making an aircraft brake disc according to a second embodiment of the present invention will be described in detail.

Figure 6:
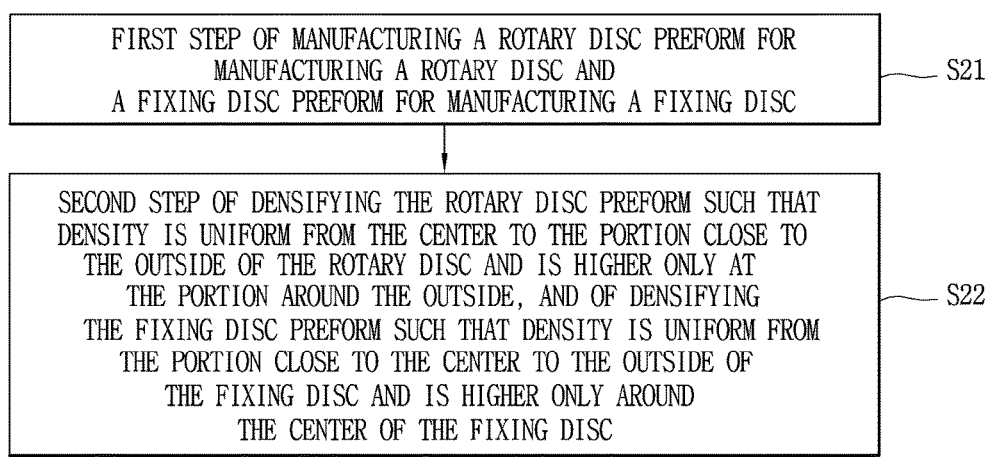
FIG. 6 is a flowchart illustrating a method for making an aircraft brake disc according to a second embodiment of the present invention.

FIG. 6 is a flowchart illustrating a method for making an aircraft brake disc according to a second embodiment of the present invention.

As illustrated in FIG. 6, a method for making an aircraft brake disc according to the second embodiment of the present invention includes: a first step of manufacturing a rotary disc preform for manufacturing a rotary disc and a fixing disc preform for manufacturing a fixing disc (S21); and a second step of densifying the rotary disc preform such that density is uniform from the center to the portion close to the outside of the rotary disc and is higher only at the portion around the outside, and of densifying the fixing disc preform such that density is uniform from the portion close to the center to the outside of the fixing disc and is higher only around the center of the fixing disc (S22).

The first step (S21) is described.

The rotary disc preform and the fixing disc preform may be formed in the types of a two dimension preform and a three dimension preform. This was described in the first embodiment of the present invention, so it is not described here.

The second step (S22) is described.

[First Method of Densifying a Rotary Disc According to the Second Embodiment (Temperature Changed and Flow Rate Fixed)]

Figure 7A:
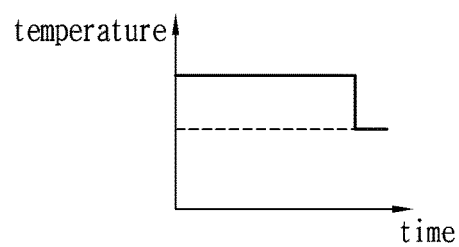
FIG. 7A is a graph illustrating a temperature change of an electrode rod with lapse of time.
Figure 7B:
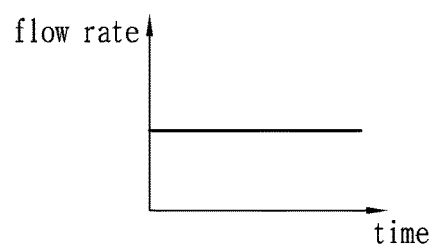
FIG. 7B is a graph illustrating a flow rate change of a reaction gas with lapse of time.
Figure 7C:
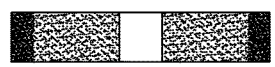
FIG. 7C is a diagram illustrating a density gradient of the rotary disc preform.
Figure 7E:
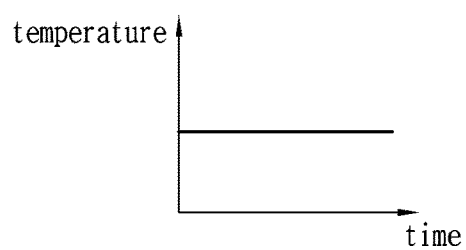
FIG. 7E is a graph illustrating a temperature change of an electrode rod with lapse of time.
Figure 7F:
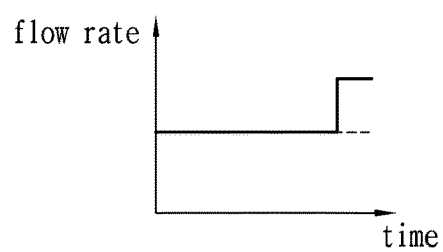
FIG. 7F is a graph illustrating a flow rate change of a reaction gas with lapse of time.
Figure 7G:
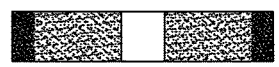
FIG. 7G is a diagram illustrating a density gradient of the rotary disc preform.

FIG. 7A is a graph illustrating a temperature change of an electrode rod with lapse of time. FIG. 7B is a graph illustrating a flow rate change of a reaction gas with lapse of time. FIG. 7C is a diagram illustrating a density gradient of the rotary disc preform. FIG. 7E is a graph illustrating a temperature change of an electrode rod with lapse of time. FIG. 7F is a graph illustrating a flow rate change of a reaction gas with lapse of time. FIG. 7G is a diagram illustrating a density gradient of the rotary disc preform.

Referring to FIGS. 2, 7A, 7B, 7C, 7E, 7F and 7G, the electrode rod 3 is put into the hole H of the rotary disc preform P.

As illustrated in FIG. 7A, the temperature of the electrode rod 3 is kept high for a predetermined time, and when the carbon of the reaction gas is deposited at the end of the rotary disc preform P, the temperature is rapidly decreased and then maintained at the level. For this purpose, a cooler (not illustrated) is disposed inside the electrode rod 3. As illustrated in FIG. 7B, the flow rate of the reaction gas is kept constant, even though time passes.

Accordingly, as illustrated in FIG. 7C, the carbon of the reaction gas is uniformly deposited from the center to the portion close to the outside of the rotary disc preform P, but is suddenly much deposited at the outside of the rotary disc preform P.

The reason is as follows.

The higher the temperature of the electrode rod 3, the more the heat rapidly transfers and the more the area where the carbon in the reaction gas can be deposited rapidly increases, whereas the lower the temperature of the electrode rod 3, the more the heat slowly transfers and the more the area where the carbon in the reaction gas can be deposited slowly increases.

Since the flow rate of the reaction gas is constant, as an area increases at the same speed, the amount of the carbon of the reaction gas that can be deposited per unit area is also constant. When the temperature of the electrode rod 3 rapidly decreases, the increase speed of the area also rapidly decreases, so the carbon of the reaction gas is deposited in the decreased area.

Accordingly, the density of the rotary disc preform P is uniform from the center to the portion close to the outside and increases only around the outside.

Therefore, the density of the rotary disc made of the rotary disc preform P is also uniform from the center to the portion close to the outside and increases only around the outside.

[First Method of Densifying a Fixing Disc According to the Second Embodiment (Temperature Changed and Flow Rate Fixed)]

Figure 8A:
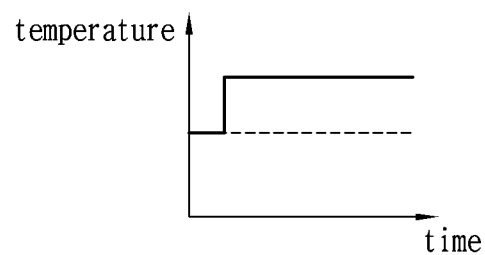
FIG. 8A is a graph illustrating a temperature change of an electrode rod with lapse of time.
Figure 8B:
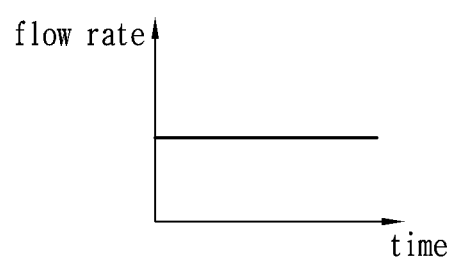
FIG. 8B is a graph illustrating a flow rate change of a reaction gas with lapse of time.
Figure 8C:
FIG. 8C is a diagram illustrating a density gradient of the fixing disc preform.
Figure 8E:
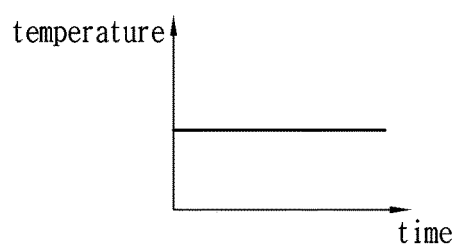
FIG. 8E is a graph illustrating a temperature change of an electrode rod with lapse of time.
Figure 8F:
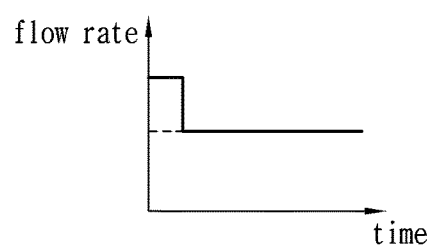
FIG. 8F is a graph illustrating a flow rate change of a reaction gas with lapse of time.
Figure 8G:
FIG. 8G is a diagram illustrating a density gradient of the fixing disc preform.

FIG. 8A is a graph illustrating a temperature change of an electrode rod with lapse of time. FIG. 8B is a graph illustrating a flow rate change of a reaction gas with lapse of time. FIG. 8C is a diagram illustrating a density gradient of the fixing disc preform. FIG. 8E is a graph illustrating a temperature change of an electrode rod with lapse of time. FIG. 8F is a graph illustrating a flow rate change of a reaction gas with lapse of time. FIG. 8G is a diagram illustrating a density gradient of the fixing disc preform.

Referring to FIGS. 2, 8A, 8B, 8C, 8E, 8F and 8G, the electrode rod 3 is put into the hole H of the fixing disc preform P.

As illustrated in FIG. 8A, the temperature of the electrode rod 3 is maintained at a low level for a predetermined time until the carbon of the reaction gas is deposited at the center of the fixing disc preform P, but when the deposition of the carbon of the reaction gas at the center is finished, the temperature of the electrode rod 3 is rapidly increased and maintained at the level. As illustrated in FIG. 8B, the flow rate of the reaction gas is kept constant, even though time passes.

Accordingly, as illustrated in FIG. 8C, the carbon of the reaction gas is much deposited only at the center of the fixing disc preform P, and is uniformly deposited from the center to the outside of the fixing disc preform P.

The reason is as follows.

The higher the temperature of the electrode rod 3, the more the heat rapidly transfers and the more the area where the carbon in the reaction gas can be deposited rapidly increases, whereas the lower the temperature of the electrode rod 3, the more the heat slowly transfers and the more the area where the carbon in the reaction gas can be deposited slowly increases.

Since the flow rate of the reaction gas is constant, as an area increases at the same speed, the amount of the carbon of the reaction gas that can be deposited per unit area is also constant.

When the temperature of the electrode rod 3 rapidly increases, the increase speed of the area also rapidly increases, so the carbon of the reaction gas is deposited in the increased area.

Accordingly, the density of the fixing disc preform P is high only around the center and is uniform from the portion around the center to the outside.

Therefore, the density of the fixing disc made of the fixing disc preform P is also high only around the center and is uniform from the portion around the center to the outside.

[Second Method of Densifying a Rotary Disc According to the Second Embodiment (Temperature Fixed and Flow Rate Changed)]

As illustrated in FIG. 7E, the temperature of the electrode rod 3 is kept constant, even though time passes. As illustrated in FIG. 7F, the flow rate of the reaction gas is kept low, and when the carbon of the reaction gas is deposited at the end of the rotary disc preform P, the flow rate is rapidly increased and then maintained at the level. Accordingly, as illustrated in FIG. 7G, the carbon of the reaction gas is uniformly deposited from the center to the portion close to the outside of the rotary disc preform P, but is suddenly much deposited at the outside of the rotary disc preform P.

The reason is as follows.

Since the temperature of the electrode rod 3 is constant, heat uniformly transfers and the area, where the reaction gas can be thermally decomposed, uniformly increases. Since the flow rate of the reaction gas is constant, as an area increases at the same speed, the amount of the carbon of the reaction gas that can be deposited per unit area is also constant. When the amount of the reaction gas is rapidly increased, more carbon of the reaction gas is deposited per unit area.

Accordingly, the density of the rotary disc preform P is uniform from the center to the portion close to the outside and increases only around the outside.

Therefore, the density of the rotary disc made of the rotary disc preform P is also uniform from the center to the portion close to the outside and increases only around the outside.

[Second Method of Densifying a Fixing Disc According to the Second Embodiment (Temperature Fixed and Flow Rate Changed)]

As illustrated in FIG. 8E, the temperature of the electrode rod 3 is kept constant, even though time passes. As illustrated in FIG. 8F, the flow rate of the reaction gas is kept much only when the carbon of the reaction gas is deposited at the center of the fixing disc preform P, and then it is rapidly decreases around the center of the fixing disc preform P and then maintained at the level.

Accordingly, as illustrated in FIG. 8G, the carbon of the reaction gas is much deposited only at the center of the fixing disc preform P, and is uniformly less deposited from the portion around the center to the outside of the fixing disc preform P.

The reason is as follows.

Since the temperature of the electrode rod 3 is constant, heat uniformly transfers and the area, where the reaction gas can be thermally decomposed, uniformly increases. Since the flow rate of the reaction gas is constant, as an area increases at the same speed, the amount of the carbon of the reaction gas that can be deposited per unit area is also constant. When the amount of the reaction gas is rapidly decreased, less carbon of the reaction gas is deposited per unit area.

Accordingly, the density of the fixing disc preform P is high only around the center and is uniform from the portion around the center to the outside.

Therefore, the density of the fixing disc made of the fixing disc preform P is also high only around the center and is uniform from the portion around the center to the outside.

Figure 9:
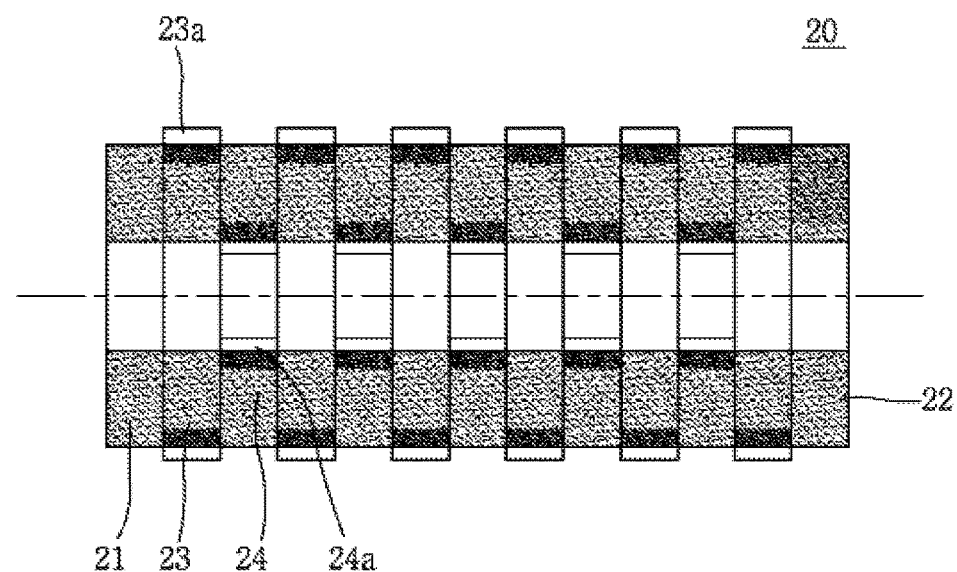
FIG. 9 is a diagram illustrating an aircraft brake disc manufactured by the method for making an aircraft brake disc according to the second embodiment of the present invention.

FIG. 9 is a diagram illustrating an aircraft brake disc manufactured by the method for making an aircraft brake disc according to the second embodiment of the present invention.

As illustrated in FIG. 9, an aircraft brake disc 20 manufactured by the method for making an aircraft brake disc according to the second embodiment of the present invention includes a pressure disc 21, a rear disc 22, and rotary discs 23 and fixing discs 24 that are alternately disposed between the pressure disc 21 and the rear disc 22. A drive groove 23a where a drive key is inserted is formed on the outside of the rotary disc 23. A spline groove 24a where splines are inserted is formed at the center of the fixing disc 24.

The density of the rotary disc 23 is uniform from the center to the portion around the outside and is high only around the outside. The density of the fixing disc 24 is high only around the center and is uniform from the portion around the center to the outside.

In the second embodiment, the density of the rotary disc 23 is uniform at 1.7 $g/cm^3$ from the center to the portion around the outside, and is 1.9 $g/cm^3$ only around the outside. Since the larger the density, the higher the strength, strength is highest around the drive groove 23a.

The density of the fixing disc 24 is 1.9 $g/cm^3$ only around the center and is uniform at 1.7 $g/cm^3$ from the portion around the center to the outside. Since the larger the density, the higher the strength, strength is highest around the spline groove 24a.

As set forth above, according to exemplary embodiments of the invention, it is possible to increase the density around the outside of a rotary disc where a drive key groove is formed. Accordingly, it is possible to sufficiently protect the rotary disc from torque and shock transmitted from a drive key.

Further, according to the present invention, it is possible to increase the density around the center of a fixing disc where a spline groove is formed. Accordingly, it is possible to sufficiently protect the fixing disc from torque and shock transmitted from splines.

While the present invention has been illustrated and described in connection with the exemplary embodiments, it will be apparent to those skilled in the art that modifications and variations can be made without departing from the spirit and scope of the invention as defined by the appended claims.

What is claimed is:

1. A method for making an aircraft brake disc, comprising:
  a first step of manufacturing a rotary disc preform and a fixing disc preform, wherein the rotary disc preform is used for manufacturing a rotary disc and the fixing disc preform is used for manufacturing a fixing disc, and wherein each of the rotary disc preform and the fixing disc preform comprises a center portion around a center hole of the respective disc preform and further comprises an outside portion around the center portion of the respective disc preform; and
  a second step of
  (i) densifying the rotary disc preform such that the outside portion of the rotary disc preform, which is coupling to a drive key of the rotary disc, has a greater density than the center portion of the rotary disc preform, the densifying step comprising
    (i-1) densifying the center portion of the rotary disc preform to 1.7 $g/cm^3$; and
    (i-2) densifying the outside portion of the rotary disc preform to 1.9 $g/cm^3$, to thereby make strength higher at the outside portion of the rotary disc preform to prevent the outside portion of the rotary disc from cracking or breaking when a brake system is operated; and
  (ii) densifying the fixing disc preform such that the center portion of the rotary disc preform, which is coupling to a drive key of the fixing disc, has a greater density than the outside portion of the fixing disc preform, the densifying step comprising (ii-1) densifying the outside portion of the fixing disc preform to 1.7 g/cm$^3$; and
(ii-2) densifying the center portion of the fixing disc preform to 1.9 g/cm$^3$, to thereby make strength higher at the center portion of the fixing disc preform to prevent the center portion of the fixing disc from cracking or breaking when a brake system is operated.

* * * * *